US008354623B2

(12) United States Patent
Matsuura

(10) Patent No.: US 8,354,623 B2
(45) Date of Patent: Jan. 15, 2013

(54) TREATMENT APPARATUS, TREATMENT METHOD, AND STORAGE MEDIUM

(75) Inventor: Hiroyuki Matsuura, Oshu (JP)

(73) Assignee: Tokyo Electron Limited, Tokyo (JP)

( * ) Notice: Subject to any disclaimer, the term of this patent is extended or adjusted under 35 U.S.C. 154(b) by 1034 days.

(21) Appl. No.: 12/314,082

(22) Filed: Dec. 3, 2008

(65) Prior Publication Data

US 2009/0145890 A1 Jun. 11, 2009

(30) Foreign Application Priority Data

Dec. 7, 2007 (JP) ................................. 2007-317396

(51) Int. Cl.
*H05B 6/10* (2006.01)
*F27B 5/14* (2006.01)
*F27D 5/00* (2006.01)
*H01L 21/205* (2006.01)
*C23C 16/46* (2006.01)

(52) U.S. Cl. ........ 219/634; 219/635; 219/647; 118/725; 118/728; 438/795

(58) Field of Classification Search ................. None
See application file for complete search history.

(56) References Cited

U.S. PATENT DOCUMENTS

| 4,263,872 | A * | 4/1981 | Ban | 118/721 |
| 5,038,711 | A * | 8/1991 | Dan et al. | 118/715 |
| 5,525,780 | A * | 6/1996 | Moslehi | 219/618 |
| 6,932,872 | B2 * | 8/2005 | Hamaguchi | 118/725 |
| 7,510,986 | B2 * | 3/2009 | Miura | 438/796 |
| 2003/0094451 | A1 * | 5/2003 | Hamaguchi | 219/635 |
| 2003/0166346 | A1 * | 9/2003 | Park et al. | 438/785 |
| 2003/0209326 | A1 * | 11/2003 | Lee et al. | 156/345.52 |
| 2005/0183820 | A1 * | 8/2005 | Fukuda et al. | 156/345.27 |
| 2006/0032848 | A1 * | 2/2006 | Lee et al. | 219/600 |
| 2007/0167026 | A1 * | 7/2007 | Miura | 438/758 |

(Continued)

FOREIGN PATENT DOCUMENTS

CN 1207235 2/1999

(Continued)

OTHER PUBLICATIONS

JP2003-068658, Hiroshi et al, Mar. 2003, partial translation: specification & description of drawings.*

(Continued)

*Primary Examiner* — Joseph M Pelham
(74) *Attorney, Agent, or Firm* — Smith, Gambrell & Russell, LLP

(57) ABSTRACT

A treatment apparatus uses an inductive heating method to allow an object to be heated while preventing a treatment chamber from being heated. The treatment apparatus for performing a heat treatment on the object has a treatment chamber and an induction heating coil section. The treatment chamber is capable of accommodating a plurality of objects. The induction heating coil section is wound around an outer circumference of the treatment chamber. The treatment apparatus also has a high frequency power supply and a gas supply unit. The high frequency power supply applies high frequency power to the induction heating coil section. The gas supply unit introduces a necessary gas to the treatment chamber. A holding unit is inserted in and removed from the treatment chamber under the condition that the holding unit holds the object and an induction heating generator adapted to be inductively heated by means of a high frequency wave emitted by the induction heating coil section.

8 Claims, 8 Drawing Sheets

U.S. PATENT DOCUMENTS

2009/0178620 A1 * 7/2009 Juergensen et al. .......... 118/725

FOREIGN PATENT DOCUMENTS

| JP | 8-44286 | 2/1996 |
| --- | --- | --- |
| JP | 9-213647 | 8/1997 |
| JP | 9-246190 | 9/1997 |
| JP | 9-246257 | 9/1997 |
| JP | 9-330884 | 12/1997 |
| JP | 2002-9009 | 1/2002 |
| JP | 2002-313730 | 10/2002 |
| JP | 2003-68658 | 3/2003 |
| JP | 2003-100643 | 4/2003 |
| JP | 2003100643 A * | 4/2003 |
| JP | 2003-151737 | 5/2003 |
| JP | 2006-54432 | 2/2006 |
| JP | 2006-287194 | 10/2006 |
| KR | 10-2003-0041084 | 5/2003 |
| WO | 97/25835 | 7/1997 |

OTHER PUBLICATIONS

JP2003-100643A, Apr. 2003, Dobashi, partial translation and description of figures.*

Chinese Office Action mailed on Nov. 10, 2011 for Application No. 200810182932.7 with English translation.

Japanese Office Action mailed on Nov. 22, 2011 for Application No. 2007-317396 with English translation.

Chinese Office Action issued on Mar. 16, 2011 for Application No. 200810182932.7 w/ English language translation.

Korean Office Action mailed on Jul. 29, 2011 for Application No. 10-2008-122862 with English translation.

* cited by examiner

CARRYING IN AND OUT SIDE OF WAFER

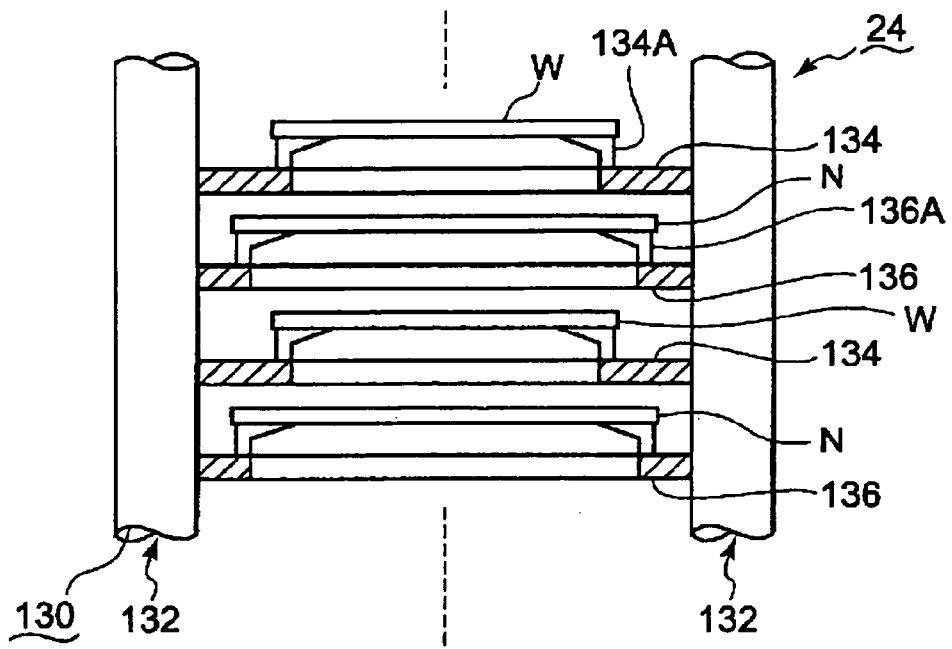
F I G. 9
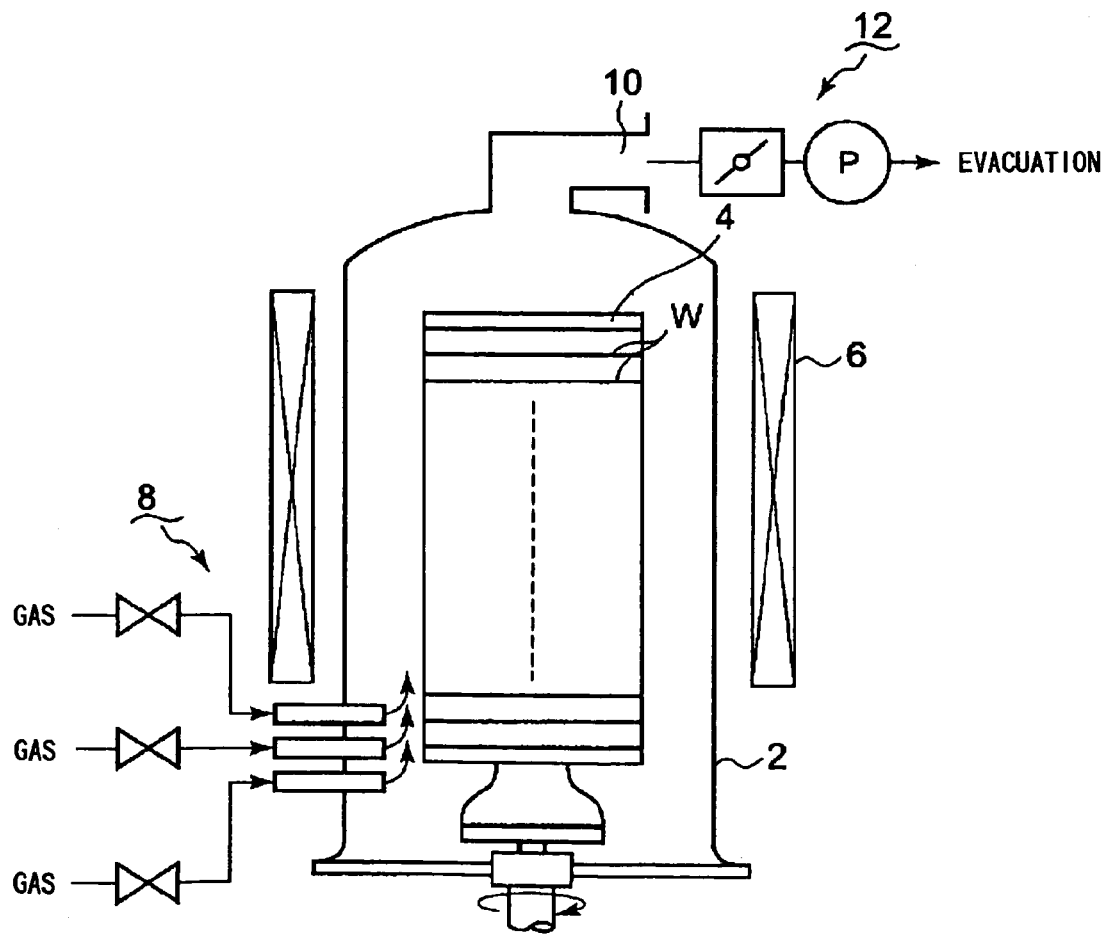
F I G. 10

TREATMENT APPARATUS, TREATMENT METHOD, AND STORAGE MEDIUM

CROSS-REFERENCE TO RELATED APPLICATIONS

This application claims the benefit of Japanese Patent Application No. 2007-317396 filed on Dec. 7, 2007. The entire disclosure and contents of the above application are incorporated herein by reference.

BACKGROUND OF THE INVENTION

1. Field of the Invention

The present invention relates to a treatment apparatus, a treatment method, and a storage medium, which are provided to perform heat treatments such as a film formation treatment for depositing a thin film on the surface of an object (such as a semiconductor wafer) to be treated.

2. Description of the Related Art

It is general that heat treatments such as a film formation treatment, etching treatment, oxidation treatment, diffusion treatment and reforming treatment are performed on a semiconductor wafer including a silicon substrate in order to manufacture a semiconductor integrated circuit. The film formation treatment is performed in a batch type film formation apparatus, for example. Such batch type film formation apparatuses are disclosed in JP-A-8-44286, JP-A-9-246257, JP-A-2002-9009, JP-A-2006-54432, JP-A-2006-287194 and the like.

As shown in FIG. 10, semiconductor wafers W, which are objects to be treated, are held by a wafer boat 4 at multiple stages and accommodated in a vertical treatment chamber 2 made of quartz. A cylindrical heater 6 surrounds the treatment chamber 2 and heats the wafers W to a temperature approximately ranging from 600° C. to 700° C.

A gas supply unit 8 supplies a gas required for treatments to a lower portion of the treatment chamber 2. For example, a gas for film formation is supplied to the treatment chamber 2 for a film formation treatment. Simultaneously, the treatment chamber 2 is evacuated by a vacuum exhaust system 12 through an exhaust port 10 provided at a ceiling portion of the treatment chamber 2 to ensure that pressure of an atmosphere within the treatment chamber 2 is maintained to a predetermined level. Then, heat treatments such as the film formation treatment are performed.

SUMMARY OF THE INVENTION

The conventional treatment apparatus described above has the heater 6 provided on the outer circumferential side of the treatment chamber 2 to heat the wafers W by means of Joule heat. In order to heat the wafers W accommodated in the treatment chamber 2, it is necessary to heat the treatment chamber 2 made of the quartz having a relatively large heat capacity. Consumed energy required to heat the treatment chamber 2 is significantly increased.

Since the treatment chamber 2 is heated to a high temperature, an unnecessary film may be deposited on the surfaces of the wafers W heated to a high temperature and on an inner wall surface of the treatment chamber 2 heated to the high temperature. As a result, the unnecessary film may be the source of a particle and shorten a cleaning cycle.

In addition, it is necessary to prevent a dopant from unnecessarily diffusing since a junction portion of a semiconductor element and the like have been minimized. It is therefore requested to quickly increase and decrease the temperatures of the wafers W in the heat treatments. However, since it is necessary to increase and decrease the temperature of the treatment chamber 2 having the large heat capacity simultaneously with the increase and decrease in the temperatures of the wafers W, it is extremely difficult to quickly increase and decrease the temperatures of the wafers W.

The present invention has been devised to solve the above-mentioned problems. An object of the present invention is to provide a treatment apparatus and treatment method, which are capable of heating an object to be treated by means of induction heat, preventing a treatment chamber from being heated, reducing energy consumed, preventing an unnecessary film from being deposited on an inner surface of the treatment chamber, and quickly increasing and decreasing the temperature of the object to be treated.

According to the present invention, an treatment apparatus for performing a heat treatment on an object to be treated comprises: a treatment chamber capable of accommodating a plurality of objects; an induction heating coil section wound around an outer circumference of the treatment chamber; a high frequency power supply that is connected with the induction heating coil section and adapted to apply high frequency power to the induction heating coil section; gas supply means that is provided for the treatment chamber and adapted to introduce a gas into the treatment chamber; and holding means that is inserted in and removed from the treatment chamber under the condition that the holding means holds the object and an induction heating generator, the induction heating generator being adapted to be inductively heated by means of a high frequency wave emitted by the induction heating coil and to thereby heat the object.

The induction heating generator provided in the treatment chamber is inductively heated by means of the high frequency wave emitted by the induction heating coil wound around the outer circumference of the treatment chamber. The object to be treated is arranged close to the induction heating generator inductively heated. The object to be treated can therefore be heated. The object is heated by means of the inductive heat while the treatment chamber is not heated. This makes it possible to reduce energy consumed, prevent an unnecessary film from being deposited on the inner surface of the treatment chamber, and quickly increase and decrease the temperatures of the objects.

In this case, the treatment chamber may have a vertically long shape.

The object to be treated and the induction heating generator may be alternately arranged in the holding means.

The induction heating coil may have a metal pipe, and the metal pipe may be connected with a cooler for causing a refrigerant to flow in the metal pipe.

The holding means may be rotatable.

The object may have a circular disk shape, and the induction heating generator may have a circular disk shape and a diameter larger than that of the object.

The holding means may have a first holding boat and a second holding boat, the first holding boat being adapted to hold the object, the second holding boat being adapted to hold the induction heating generator.

At least one of the first and second holding boats may be capable of moving up and down to change the relative positions of the first and second holding boats to each other and to allow the object and the induction heating generator to be arranged close to and apart from each other.

The induction heating generator is made of one or more of materials selected from the group consisting of a conductive ceramic material, graphite, glassy carbon, conductive quartz and conductive silicon.

According to the present invention, a treatment method for performing a heat treatment on an object to be treated comprises the steps of: inserting holding means in a treatment chamber under the condition that the holding means holds the object and an induction heating generator, the induction heating generator being adapted to be inductively heated by means of a high frequency wave emitted by an induction heating coil section wound around an outer circumference of the treatment chamber and to thereby heat the object; and introducing a necessary gas into the treatment chamber while introducing the high frequency wave into the induction heating generator to inductively heat the induction heating generator, and heating the object by means of the induction heating generator inductively heated in the heat treatment.

In this case, a plurality of the objects to be treated and a plurality of the induction heating generators may be alternately arranged in the holding means.

The object to be treated and the induction heating generator may be capable of being arranged close to and apart from each other.

According to the present invention, a storage medium stores a program that is used for a treatment method for performing a heat treatment on an object to be treated and runs on a computer, wherein the treatment method includes the steps of: inserting holding means in a treatment chamber under the condition that the holding means holds the object and an induction heating generator, the induction heating generator being adapted to be inductively heated by means of a high frequency wave emitted by an induction heating coil section wound around an outer circumference of the treatment chamber and to thereby heat the object; and introducing a necessary gas into the treatment chamber while introducing the high frequency wave into the induction heating generator to inductively heat the induction heating generator, and heating the object by means of the induction heating generator inductively heated in the heat treatment.

In accordance with the treatment apparatus, the treatment method and the storage medium according to the present invention, the following excellent effects achieved. The induction heating generator provided in the treatment chamber can be inductively heated by means of the high frequency wave emitted by the induction heating coil section wound around the outer circumference of the treatment chamber. The object can be arranged close to the inductively heated induction heating generator to be heated. The object can be heated by means of the induction heat under the condition that the treatment chamber is not heated. The treatment apparatus is therefore capable of suppressing energy consumed, preventing an unnecessary film from being deposited on the inner wall surface of the treatment chamber and quickly increasing and decreasing the temperature of the object.

BRIEF DESCRIPTION OF THE DRAWINGS

FIG. 9 is a partial configuration diagram of a modification of the holding means.

FIG. 10 is a diagram showing an example of the configuration of a conventional treatment apparatus.

DESCRIPTION OF THE PREFERRED EMBODIMENTS

Figure 1:
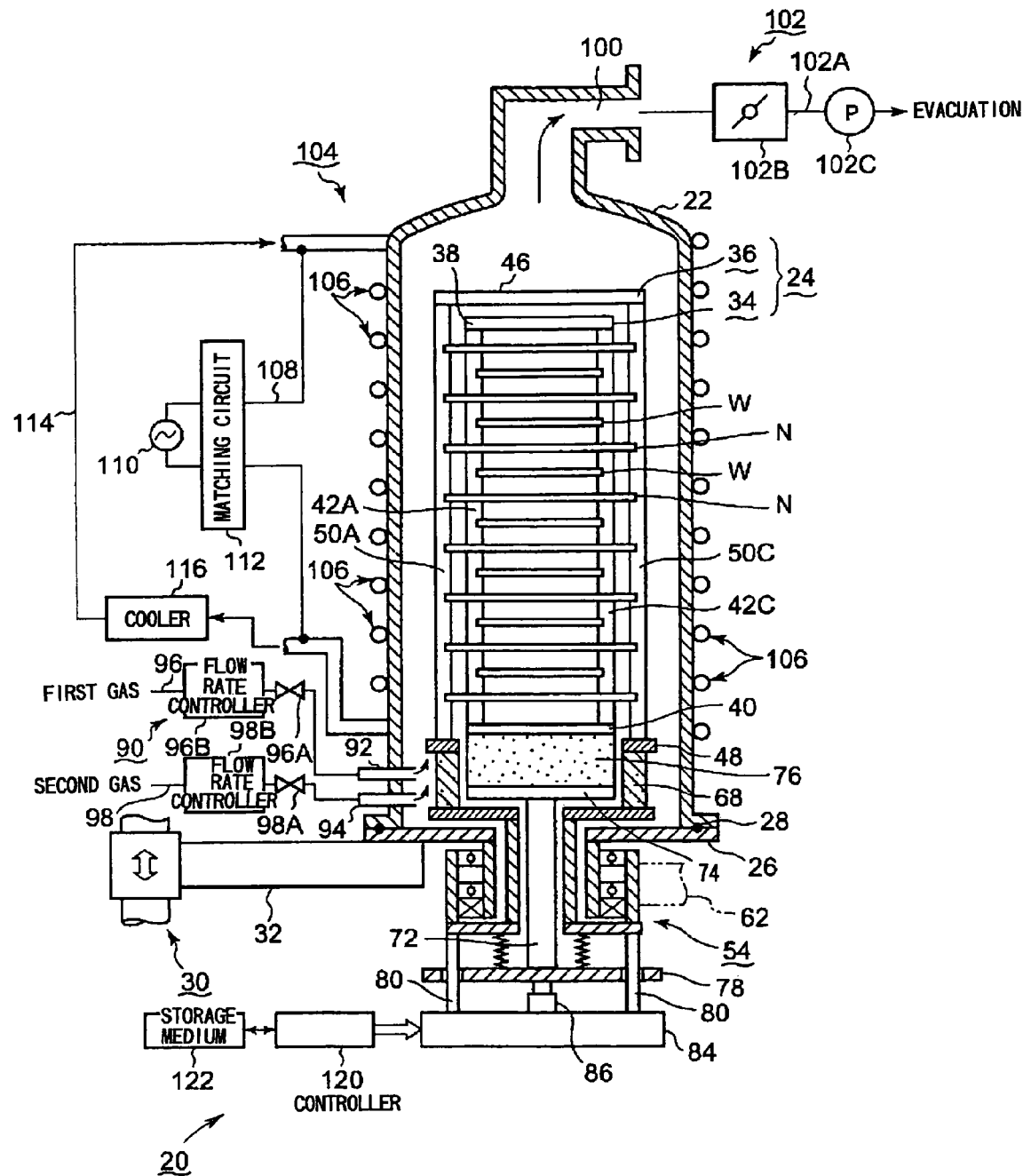
FIG. 1 is a diagram showing an example of the configuration of a treatment apparatus according to the present invention.
Figure 2:
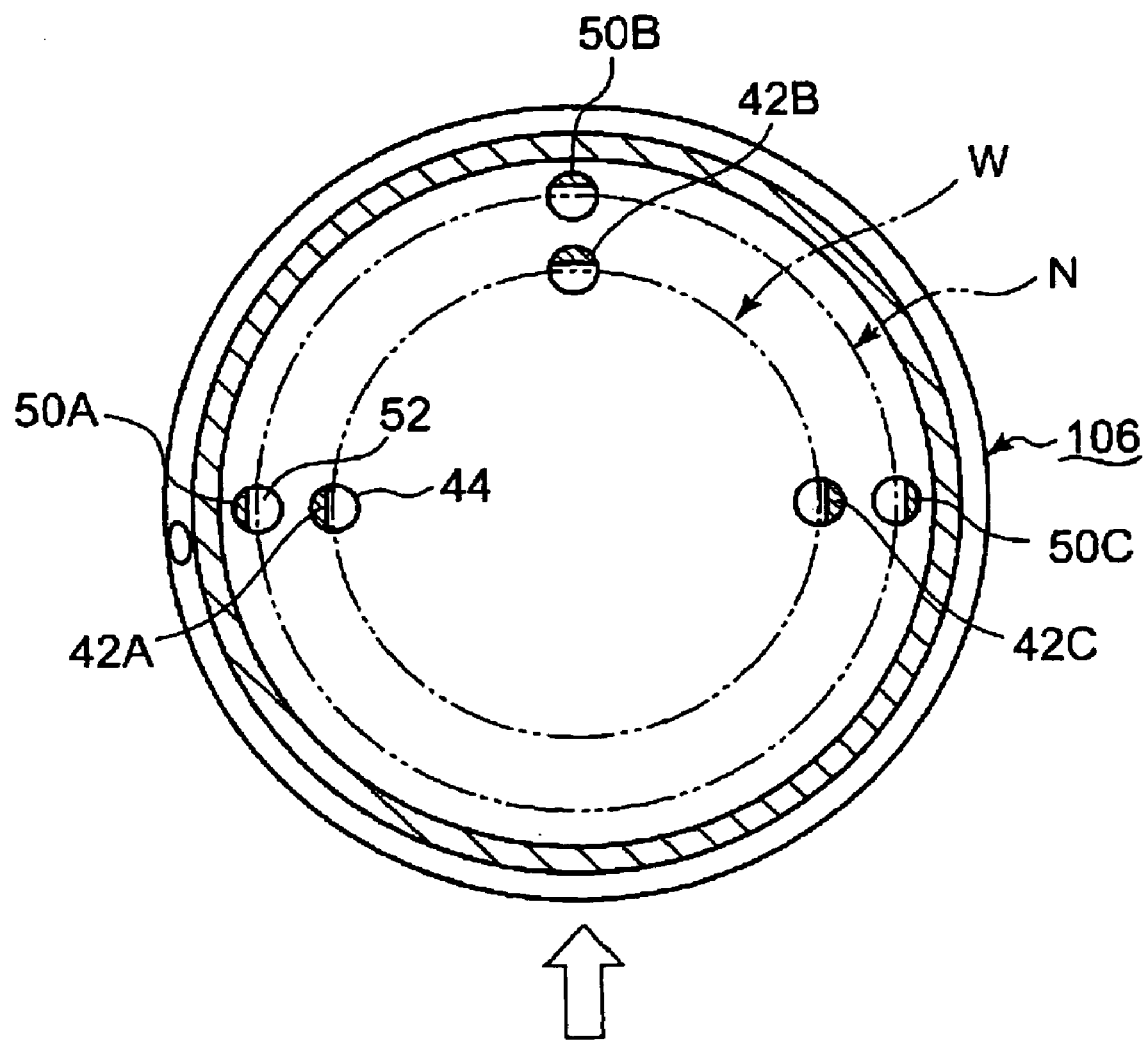
FIG. 2 is a cross sectional view of a treatment chamber.
Figure 3A:
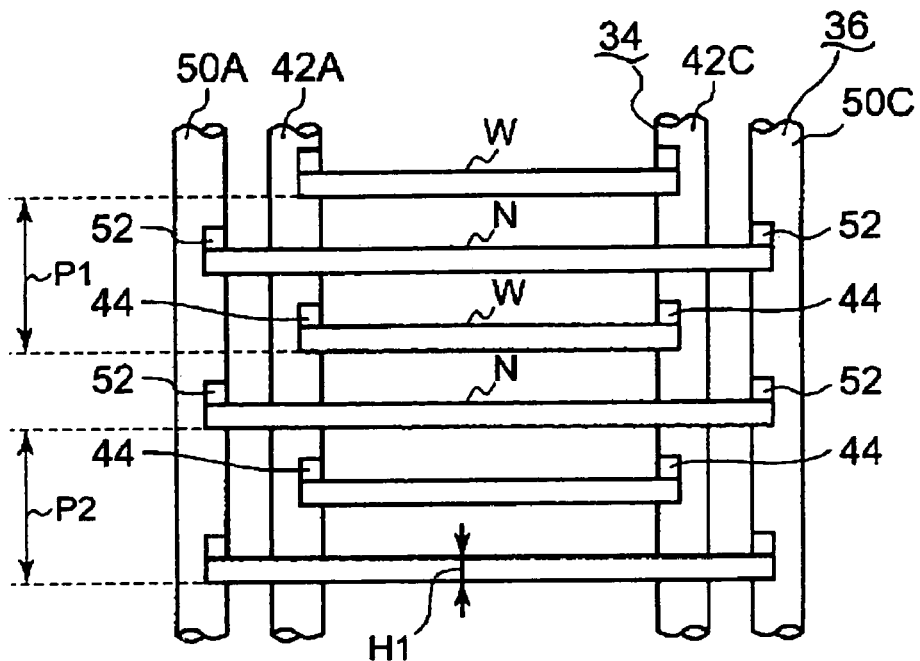
FIGS. 3A and 3B are explanatory diagrams showing a movement of holding means for holding an object to be treated and an induction heating generator.
Figure 3B:
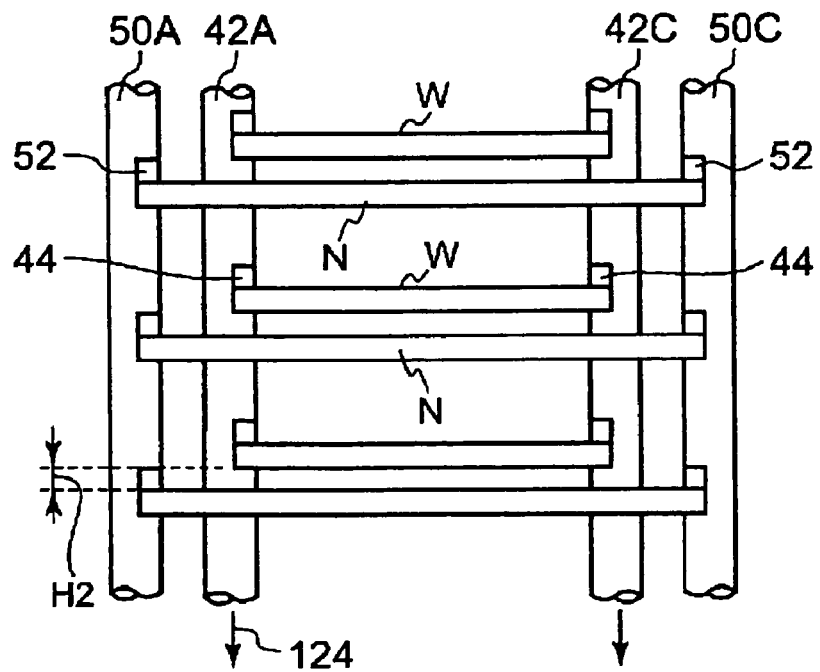
Figure 4:
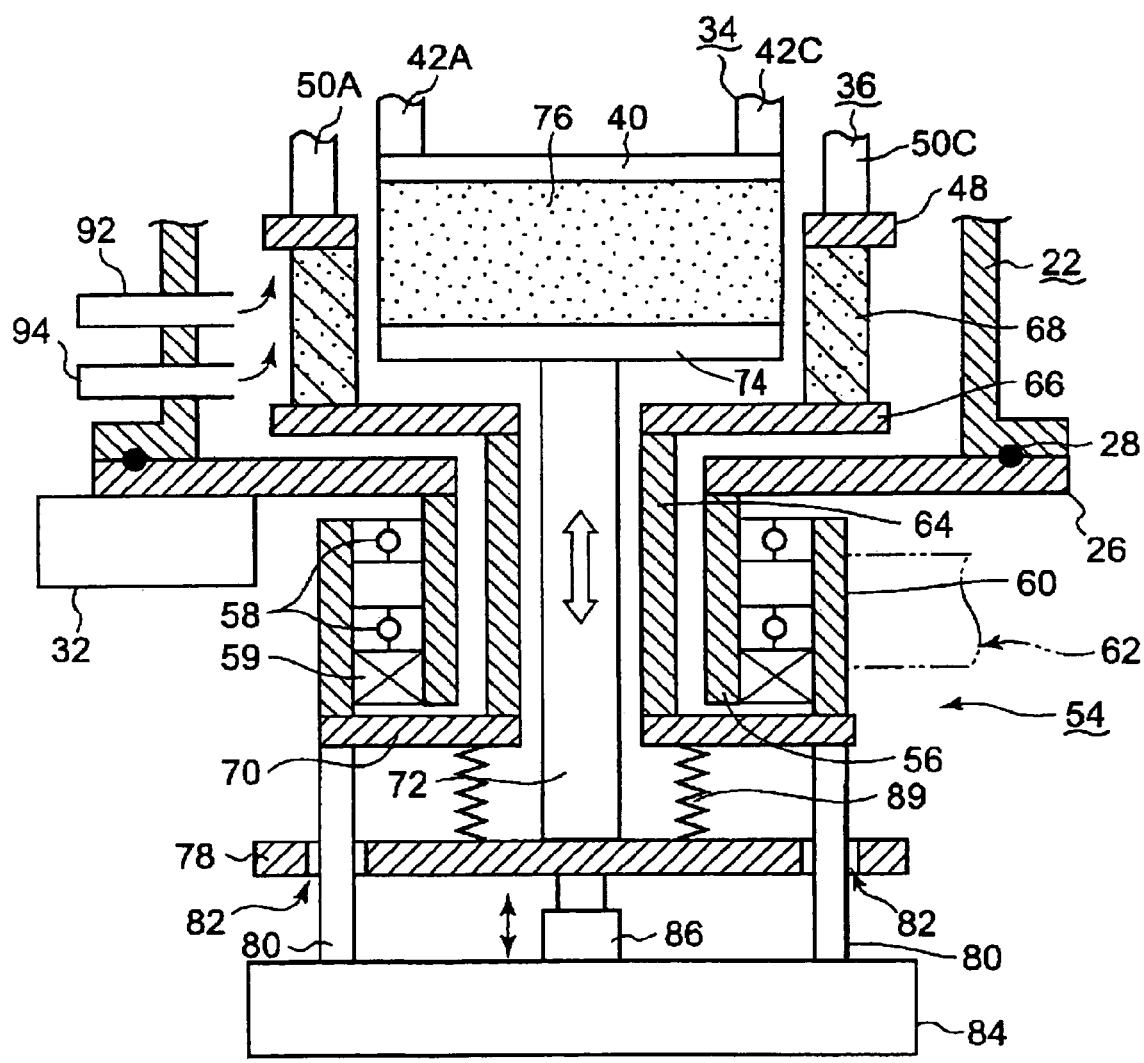
FIG. 4 is an enlarged cross sectional view of a rotary mechanism provided at a lower portion of the treatment chamber.

A treatment apparatus and treatment method according to an embodiment of the present invention are described below with reference to the accompanying drawings. FIG. 1 is a diagram showing an example of the configuration of the treatment apparatus according to the present invention. FIG. 2 is a cross sectional view of a treatment chamber. FIGS. 3A and 3B are explanatory diagrams showing a movement of holding means for holding an object to be treated and an induction heating generator. FIG. 4 is an enlarged cross sectional view of a rotary mechanism provided at a lower end portion of the treatment chamber 22. A film formation treatment will be described below as one of heat treatments as an example.

In FIG. 1, reference numeral 20 denotes the treatment apparatus according to the present invention. The treatment apparatus 20 has a cylindrical, vertical treatment chamber 22. A lower end portion of the treatment chamber 22 is open. The treatment chamber 22 has a predetermined length measured in a vertical direction. The treatment chamber 22 is capable of accommodating a plurality of wafers W (described later). The treatment chamber 22 may be made of quartz having high heat resistance.

The treatment apparatus 20 has a holding unit 24 capable of moving up and down. The holding unit 24 is capable of being inserted in and removed from the treatment chamber 22 on the bottom side of the treatment chamber 22. The wafers W (objected to be treated) having circular disk shapes are arranged at multiple stages and at a predetermined interval in the holding unit 24, and the induction heating generators N (which are the feature of the present invention) are arranged at multiple stages and at a predetermined interval in the holding unit 24.

When the holding unit 24 is inserted in the treatment chamber 22, the opening provided at the lower end portion of the treatment chamber 22 is closed by a lid 26 made of quartz, a stainless plate or the like. In this case, a seal member 28 such as an O ring is present between the lower end portion of the treatment chamber 22 and the lid 26 in order to maintain airtightness of the treatment chamber 22.

The lid 26 and the holding unit 24 are held by an end portion of an arm 32 provided in an elevation mechanism 30 such as a boat elevator to ensure that the lid 26 and the holding unit 24 are capable of moving up and down in an integrated manner.

In the present embodiment, the holding unit 24 has a first holding boat 34 and a second holding boat 36. The first holding boat 34 is adapted to hold the semiconductor wafers W, while the second holding boat 36 is adapted to hold the induction heating generators N.

Specifically, the first holding boat 34 is made of quartz that is a heat resistant material. The first holding boat 34 has a circular ring-shaped top plate 38, a circular ring-shaped bottom plate 40, and columns 42A, 42B and 42C. The columns 42A, 42B and 42C are erected between the top plate 38 and the bottom plate 40. The number of the columns is three as shown in FIG. 2 (only two columns are shown in FIG. 1).

The three columns 42A to 42C are arranged along a half circular arc present in a substantially horizontal plane as shown in FIG. 2. A gap between the columns 42A and 42B is equal to a gap between the columns 42B and 42C. A fork holding the wafers W (not shown) carries the wafers W into and out of the first holding boat 34 on the side of a half circular arc located on the opposite side to the half circular arc along which the columns 42A to 42C are provided.

Each of the columns 42A to 42C has grooves 44 arranged at the same interval in a longitudinal direction thereof and on the inner side thereof as shown in FIGS. 3A and 3B. Each of the grooves 44 are adapted to hold a circumferential edge of the wafer W to ensure that the wafers W can be arranged at multiple stages at the same interval. The number of the wafers W arranged is approximately 10 to 55, for example.

The second holding boat 36 is larger than the first holding boat 34 in a substantially horizontal plane. The second holding boat 36 surrounds the first holding boat 34.

The second holding boat 36 is formed in the same manner as the first holding boat 34. That is, the second holding boat 36 is made of quartz that is a heat resistant material. The second holding boat 36 has a circular ring-shaped top plate 46, a circular ring-shaped bottom plate 48, and columns 50A, 50B and 50C. The columns 50A, 50B and 50C are erected between the top plate 46 and the bottom plate 48. The number of the columns is three as shown in FIG. 2 (only two columns are shown in FIG. 1).

The three columns 50A to 50C are arranged along a half circular arc in a substantially horizontal plane as shown in FIG. 2. A gap between the columns 50A and 50B is equal to a gap between the columns 50B and 50C. A fork holding the wafers W (not shown) carries the induction heating generators N into and out of the second holding boat 36 on the side of a half circular arc located on the opposite side to the half circular arc along which the columns 50A to 50C are provided.

Each of the columns 50A to 50C has grooves 52 arranged at the same interval in a longitudinal direction thereof and on the inner side thereof as shown in FIGS. 3A and 3B. Each of the grooves 52 are adapted to hold a circumferential edge of the induction heating generator N to ensure that the induction heating generators N can be arranged at multiple stages at the same interval. The number of the induction heating generators N arranged is approximately 15 to 60, for example.

As the induction heating generator N, a material that is capable of generating induction heat by means of a high frequency wave and has excellent heat conductivity, e.g., a conductive ceramic material such as SiC, may be used. Each of the induction heating generators N is formed into a circular disk shape, similarly to the semiconductor wafers W. The diameters of the induction heating generators N are larger than those of the wafers W. When the diameters of the wafers W are 300 mm, the diameters of the induction heating generators N are in a range of approximately 320 mm to 340 mm.

FIG. 3A shows the positional relationship between the wafers W and the induction heating generators N when the wafers W are carried into and out of the treatment chamber 22. In FIG. 3A, the wafers W and the induction heating generators N are alternately arranged. The distance between one of the wafers W and the induction heating generator N provided above the one of the wafers W is substantially equal to the distance between the one of the wafers W and the induction heating generator N provided under the one of the wafers W. This arrangement makes it easy for the fork to carry the wafers W into and out of the treatment chamber 22.

A pitch P1 between the wafers W and a pitch P2 between the induction heating generators N are in a range of approximately 30 mm to 40 mm. The thickness H1 of each of the induction heating generators N is in a range of approximately 2 mm to 10 mm. The wafers W and the induction heating generators N are alternately arranged. One of the induction heating generators N is located at the top of the arrangement, and another one of the induction heating generators N is located at the bottom of the arrangement. This arrangement allows the wafer W located at the top and the wafer W located at the bottom to be subjected to thermal conditions that are the same as or similar to those to which the other wafers W are subjected.

The thus configured holding unit 24 can be rotated by a rotary mechanism 54 provided at the lid 26. At least one of the first and second holding boats 34 and 36 is capable of moving up and down to change the relative positions of the first and second holding boats 34 and 36 to each other.

Specifically, as shown in FIG. 4, the rotary mechanism 54 has a cylindrical fixed sleeve 56 extending downward from a central portion of the lid 26. The inner side of the fixed sleeve 56 is exposed to an atmosphere present in the treatment chamber 22. A cylindrical rotary body 60 is rotatably provided at an outer circumference of the fixed sleeve 56 via a bearing 58. A drive belt 62 extends across the rotary body 60 and is driven by a drive source (not shown) to ensure that the rotary body 60 rotates.

A magnetic fluid seal 59 is provided between the fixed sleeve 56 and the rotary body 60 at a lower portion of the bearing 58 and adapted to maintain the airtightness of the treatment chamber 22. A cylindrical, hollow rotary shaft 64 is provided in the fixed sleeve 56. There is a small gap between the rotary shaft 64 and the fixed sleeve 56.

A rotary table 66 having an opening in its central portion is attached and fixed to an upper end portion of the hollow rotary shaft 64. A cylindrical thermal insulation tube 68, which is made of, for example, quartz, is provided on the rotary table 66, and the bottom plate 48 of the second holding boat 36 is placed on the thermal insulation tube 68, in order to ensure that the second holding boat 36 is held by the rotary table 66.

A lower end portion of the hollow rotary shaft 64 is coupled with a lower end portion of the rotary body 60 via a coupling member 70 to ensure that the hollow rotary shaft 64 rotates with the rotary body 60 in an integrated manner.

A cylindrical central rotary shaft 72 extends through the inside of the hollow rotary shaft 64. There is a small gap between the central rotary shaft 72 and the hollow rotary shaft 64. A rotary table 74 is attached and fixed to an upper end portion of the central rotary shaft 72.

A cylindrical thermal insulation tube 76, which is made of, for example, quartz, is provided on the rotary table 74, and the bottom plate 40 of the first holding boat 34 is placed on the thermal insulation tube 76, in order to ensure that the first holding boat 34 is held by the rotary table 74. A lower end portion of the central rotary shaft 72 is coupled with an elevation drive plate 78.

A plurality of guide rods 80 extend downward from the rotary body 60 and through respective guide holes 82 provided in the elevation drive plate 78. Lower end portions of the guide rods 80 are fixedly coupled with a base plate 84. An actuator 86 is provided on a central portion of the base plate 84. The actuator 86 is an air cylinder, for example. The actuator 86 is adapted to lift and lower the elevation drive plate 78 by a predetermined stroke.

The actuator 86 is driven to lift and lower the central rotary shaft 72, the first holding boat 34 and the like. The amount of the stroke is in a range of approximately 20 mm to 30 mm. The actuator 86 may be driven to lift and lower the second holding boat 36, instead of the first holding boat 34. In both cases, at least one of the first and second holding boats 34 and 36 is movable upward and downward to change the relative positions of the first and second holding boats 34 and 36 to each other.

The first holding boat 34 is lifted and lowered in this way to ensure that the induction heating generators N can approach lower surfaces of the wafers W as shown in FIG. 3B. Gaps H2 between the wafers W and the induction heating generators N are in a range of approximately 2 mm to 16 mm. An extensible bellows 89 is provided between the elevation drive plate 78 and the coupling member 70 and surrounds the central rotary shaft 72 to maintain the airtightness of the treatment chamber 22 and allow the central rotary shaft 72 to move upward and downward.

Returning back to FIG. 1, a gas supply unit 90 is provided at a lower portion of the treatment chamber 22 and adapted to introduce a gas(es) required for the heat treatment into the treatment chamber 22. The gas supply unit 90 has a first gas nozzle 92 and a second gas nozzle 94. The first and second gas nozzles 92 and 94 extend through a side wall of the treatment chamber 22 and are coupled with the treatment chamber 22.

The first and second gas nozzles 92 and 94 are made of quartz, for example. The first and second gas nozzles 92 and 94 are connected with gas paths 96 and 98, respectively. The gas path 96 has a valve 96A and a flow rate controller 96B (such as a mass flow controller), and the gas path 98 has a valve 98A and a flow rate controller 98B (such as a mass flow controller). The valve 96A and the flow rate controller 96B are arranged in this order from the side of the treatment chamber 22, while the valve 98A and the flow rate controller 98B are arranged in this order from the side of the treatment chamber 22. A first gas required for film formation flows in the gas path 96, and a second gas required for film formation flows in the gas path 98. The gas paths 96 and 98 are configured to ensure that the first and second gases can be introduced into the treatment chamber 22, and the flow rates of the first and second gases can be controlled. The types of the gases can be changed when necessary. Another gas nozzle may be added to the treatment apparatus.

An exhaust port 100 is provided at a top portion of the treatment chamber 22. The exhaust port 100 is bent laterally and has an L shape. The exhaust port 100 is connected with an exhaust system 102 for exhausting a gas present in the treatment chamber 22. The exhaust system 102 has an exhaust path 102A, a pressure control valve 102B (such as a butterfly valve) and an exhaust pump 102C. The exhaust path 102A is connected with the pressure control valve 102B and the exhaust pump 102C. The pressure control valve 102B, the exhaust path 102A and the exhaust pump 102C are arranged in this order from the side of the exhaust port 100. Depending on the type of the treatment, the treatment is performed under the condition that pressure of a gas within the treatment chamber 22 is in a range of a vacuum level to an approximately atmospheric pressure level. The pressure of the gas within the treatment chamber 22 can be controlled by the exhaust system 102 to be in a range of a high vacuum level to an approximately atmospheric pressure level.

An induction heating coil section 104, which is a feature of the present invention, is provided for the treatment chamber 22. Specifically, the induction heating coil section 104 has a metal pipe 106 spirally wound around an outer circumference of the treatment chamber 22. An area in which the metal pipe 106 is present is larger in the vertical direction than an area in which the wafers W are present. The metal pipe 106 may be wound around the outer circumference of the treatment chamber 22 to ensure that there are gaps between portions of the metal pipe 106 as shown in FIG. 1. Alternatively, the metal pipe 106 may be wound without a gap between portions of the metal pipe 106. As the metal pipe 106, for example, a copper pipe may be used.

A feed line 108 is connected with a top and bottom end portions of the metal pipe 106. An end portion of the feed line 108 is connected with a high frequency power supply 110. The high frequency power supply 110 applies high frequency power to the metal pipe 106. A matching circuit 112 is provided on the feed line 108 and adapted to perform impedance matching.

As described above, the high frequency power is applied to the induction heating coil section 104 having the metal pipe 106. A high frequency wave emitted by the induction heating coil 104 passes through the side wall of the treatment chamber 22 and is introduced into the treatment chamber 22. As a result, an eddy current is generated in each of the induction heating generators N held by the second holding boat 36 to generate heat or heat the induction heating generator N. The frequency of the high frequency power supplied by the high frequency power supply 110 is in a range of 0.5 kHz to 50 kHz, preferably in a range of 1 kHz to 5 kHz.

When the frequency of the high frequency power supplied by the high frequency power supply 110 is lower than 0.5 kHz, the induction heating generators N cannot be inductively heated in an efficient manner. When the frequency of the high frequency power supplied by the high frequency power supply 110 is higher than 50 kHz, a skin effect is excessively large. In this case, only circumferential edges of the induction heating generators N are heated. Therefore, uniformity of temperatures of surface portions of each of the wafers W is significantly reduced.

A medium path 114 extends from both of the top and bottom end portions of the metal pipe 106. The medium path 114 is connected with a cooler 116. The cooler 116 allows a refrigerant to flow in the metal pipe 106 and cools the metal pipe 106. For example, cooling water may be used as the refrigerant.

Operations of the entire treatment apparatus are controlled by a controller 120. The controller 120 is, for example, a computer. The controller 120 has a storage medium 122 for storing a program designed to control the operations of the entire treatment apparatus. The storage medium 122 is a flexible disk, compact disc (CD), CD-ROM, hard disk, flash memory, DVD, or the like.

Next, a description will be made of the film formation treatment (heat treatment) using the treatment apparatus 20 having the configuration described above. As described above, operations described below are performed in accordance with the program stored in the storage medium 122.

The holding unit 24 constituted by the first and second holding boats 34 and 36 is lowered and removed from the treatment chamber 22. Then, a transfer fork (not shown) is used to transfer untreated wafers W to the first holding boat 34 of the holding unit 24 to ensure that the wafers W are held by the first holding boat 34.

In this case, the vertical positional relationship between the first and second holding boats 34 and 36 is established as shown in FIG. 3A. That is, it is easy to transfer the wafers W to the first holding boat 34 since there are large gaps between the wafers W and the induction heating generators N vertically adjacent to the respective wafers W. The induction heating generators N are transferred by a fork (not shown) to the second holding boat 36 before the transfer of the wafers W, and held by the second holding boat 36. It should be noted that the number of the induction heating generators N held by the second holding boat 36 is the same as the number of the wafers W to be subjected to a single film formation treatment, for example. The induction heating generators N are cleaned simultaneously with cleaning of the inside of the treatment chamber 22, for example.

After the transfer of the wafers W is completed, and the wafers W and the induction heating generators N are alternately arranged as shown in FIG. 3A, the elevation mechanism 30 is driven to lift the holding unit 24. The holding unit 24 is then inserted in the treatment chamber 22 from the opening provided at the lower end portion of the treatment chamber 22. The opening provided at the lower end portion of the treatment chamber 22 is sealed by the lid 26 in an airtight manner to ensure that the inside of the treatment chamber 22 is hermetically sealed.

The actuator 86 provided in the rotary mechanism 54 (that is provided under the holding unit 24) is driven to lower the elevation drive plate 78 and the central rotary shaft 72 (refer to FIG. 4) by a predetermined stroke. The central rotary shaft 72 is coupled with the elevation drive plate 78. This operation allows the first holding boat 34 (provided above the rotary table 74 (provided on the central rotary shaft 72) via the thermal insulation tube 76) to be lowered by the predetermined stroke in a direction indicated by an arrow 124 shown in FIG. 3B. This allows each of the wafers W to be close to an upper surface of the induction heating generator N provided directly under the wafer W to ensure that the wafer W can efficiently receive heat emitted by the induction heating generator N.

After the holding unit 24 becomes in the state shown in FIG. 3B, the high frequency power supply 110 is turned on and supplies high frequency power to the induction heating coil section 104 including the metal pipe 106. The application of the high frequency power to the induction heating coil section 104 causes the induction heating coil section 104 to generate a high frequency wave and introduce the high frequency wave into the treatment chamber 22. Then, the high frequency wave causes an eddy current to be generated in each of the induction heating generators N held by the second holding boat 36 to ensure that the induction heating generators N is inductively heated.

When the induction heating generators N are inductively heated, the wafers W arranged close to the respective induction heating generators N are heated by heat radiation (and the like) emitted by the induction heating generators N. Then, the temperatures of the wafers W increase. Simultaneously, the gases required for the film formation treatment, i.e., the first and second gases are supplied from the first and second gas nozzles 92 and 94 of the gas supply unit 90, while the flow rates of the gases are controlled. The treatment chamber 22 is evacuated by the exhaust system 102 through the exhaust port 100 (provided at the top portion of the treatment chamber 22) to ensure that pressure of the atmosphere within the treatment chamber 22 is maintained to a predetermined process pressure level.

The temperatures of the wafers W are measured by a thermocouple (not shown) provided in the treatment chamber 22, while the high frequency power is controlled. Thus, the temperatures of the wafers W are maintained to a predetermined process temperature. Under the condition that temperatures of the wafers W are maintained to the predetermined process temperature, a predetermined heat treatment, i.e., the film formation treatment is performed. In addition, since the rotary mechanism 54 provided for the lid 26 is driven, the film formation treatment is performed under the condition that the first and second holding boats 34 and 36 rotate at predetermined rotation speed.

Since the metal pipe 106 constituting a part of the induction heating coil section 104 is heated during the heat treatment, a refrigerant such as cooling water is supplied from the cooler 116 to ensure that the refrigerant flows in the metal pipe 106 in order to cool the metal pipe 106. In this case, it is preferable to cool an inner wall surface of the treatment chamber 22 to a temperature equal to or lower than 80° C. in order to prevent a film from being deposited on the inner wall surface of the treatment chamber 22, depending on the conditions for the reaction of the gases required for the film formation treatment.

The induction heating generators N are heated by the inductive heat generated by means of the high frequency wave. The wafers W arranged close to the respective induction heating generators N are heated by the heat emitted by the induction heating generators N. Therefore, the treatment chamber 22 having a large heat capacity is almost not heated. This can reduce energy consumed.

As described above, the treatment chamber 22 is almost not heated, and the temperature of the treatment chamber 22 is maintained to be a low temperature. This can suppress deposition of an unnecessary film on the inner wall surface of the treatment chamber 22, especially in the film formation treatment, and thereby suppress generation of a particle. Furthermore, it is possible to reduce the frequency of a cleaning process.

Since the treatment chamber 22 is almost not heated as described above, the temperatures of the wafers W can increase at high speed before the film formation treatment. After the film formation treatment is completed, the temperatures of the wafers W can be reduced at high speed. Specifically, each of the induction heating generators N has the temperature increase rate of about 6.0° C./sec, while each of the wafers W has the temperature increase rate of about 4.0° C./sec.

Since a material having relatively small resistivity and relatively excellent heat conductivity, e.g., a conductive ceramic material composed of SiC having a conductive property and the like is used as the induction heating generators N, the induction heating generators N can be inductively heated in an efficient manner under the condition that uniformity of temperatures of surface portions of each of the induction heating generators N is excellent. Therefore, the wafers W arranged close to the respective induction heating generators N can be heated under the condition that uniformity of temperatures of surface portions of each of the wafers W is excellent.

As described above, according to the present invention, the induction heating generators N placed in the treatment chamber 22 are inductively heated by means of the high frequency wave emitted by the induction heating coil section 104 (having the metal pipe 106) wound around the outer circumference of the treatment chamber 22. In addition, objects to be treated (which are, for example, the semiconductor wafers W) are arranged close to the respective induction heating generators N inductively heated and can be heated by the heat emitted by the induction heating generators N.

As described above, the objects to be treated are heated by means of the induction heat, while the treatment chamber 22 is almost not heated. The treatment apparatus is therefore capable of suppressing energy consumed, preventing an unnecessary film and the like from being deposited on the inner wall surface of the treatment chamber, and increasing and decreasing the temperatures of the objects to be treated at high speed.

Evaluation to Determine Qualification of Induction Heating Generator

Since qualification of the induction heating generators N adapted to heat the semiconductor wafers W was evaluated, the evaluation results are described below.

It is required that the induction heating generators N be inductively heated by means of a high frequency wave in an efficient manner, and have high heat conductivity. In addition, it is required that the surface portions of each of the induction heating generators N be heated as uniformly as possible. As already known, when a conductive material is inductively heated by means of a high frequency wave, an eddy current is generated in the conductive material to ensure that heat is generated by the conductive material. The density of the eddy current generated in the conductive material is exponentially larger as a point at which the eddy current is measured is closer to the surface of the conductive material. The density of the eddy current generated in the conductive material is exponentially smaller as a point at which the eddy current is measured is farther from the surface of the conductive material. That is, the skin effect occurs. When the conductive material has a disk shape, a circumferential edge of the conductive material is quickly heated, and a central portion of the conductive material is relatively slowly heated.

A current penetration depth $\delta$ is an important value in order to consider the skin effect occurring upon the inductive heating. It is preferable that the current penetration depth $\delta$ be as large as possible. The current penetration depth $\delta$ is defined as a depth ranging from the surface of the induction heating generator to the point at which the intensity of the eddy current is reduced to $1/e$ ($\cong 0.368$) of the intensity of the eddy current present on the surface of the induction heating generator. The current penetration depth $\delta$ is represented by the following formula.

$$\delta(cm)=5.03(\rho/\mu f)^{1/2}$$

where, $\rho$ is resistivity ($\mu\Omega\cdot cm$) of the induction heating generator, $\mu$ is relative magnetic permeability of the induction heating generator (relative magnetic permeability $\mu$ of a non-magnetic material is 1), and f is the frequency of high frequency power (Hz). It should be noted that relative magnetic permeability $\mu$ of SiC is 1.

Figure 5:
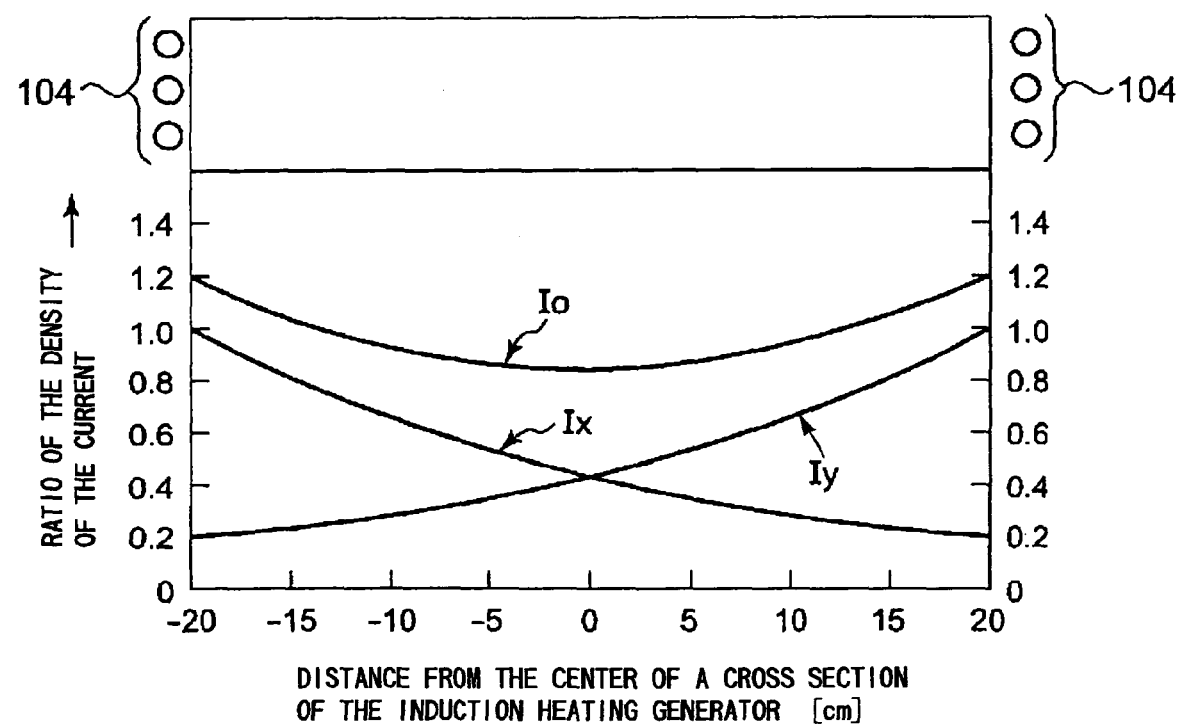
FIG. 5 is a graph showing simulation results which are distributions of eddy currents flowing in a disk-shaped induction heating generator.

A simulation is performed to obtain a distribution of the eddy current generated in the disk-shaped induction heating generator N made of the abovementioned conductive material. FIG. 5 is a graph showing the distribution of the eddy current.

In FIG. 5, a distance from the center of a cross section of the induction heating generator is plotted along the abscissa axis, while the ratio of the density of the current to the current present at the circumferential edges (corresponding to the distances of "−20 cm" and "+20 cm" from the center of the cross section of the induction heating generator in the graph of FIG. 5) of the induction heating generator is plotted along the ordinate axis. The induction heating coil section 104 is wound around an outer surface (corresponding to the rightmost and leftmost points in the graph of FIG. 5) of the induction heating generator.

In the graph, a curved line Ix indicates a distribution of the current generated in a left-side portion (of the cross section) of the induction heating coil section 104, while a curved line Iy indicates a distribution of the current generated in a right-side portion (of the cross section) of the induction heating coil section 104. A curved line Io indicates a distribution of a current obtained by summing the current indicated by the curved line Ix and the current indicated by the curved line Iy. As understood from the curved line Io, values of the currents present at the circumferential edges of the induction heating generator are large. In addition, the amounts of heat released from the circumferential edges of the induction heating generator are large. The closer to the center of the induction heating generator the current generated in the induction heating generator is, the smaller the value of the current, i.e., the amount of the released heat is.

Two types of materials, i.e., glassy carbon and conductive SiC (representing a conductive ceramic material), were used as the induction heating generator N to evaluate the ratio (hereinafter referred to as the current density ratio) of the density of a current generated at a certain portion of each of the materials to the density of a current generated at a circumferential edge of each of the materials, and dependence of the current density ratio on the frequency of high frequency power. The evaluation results are described below.

Figure 6:
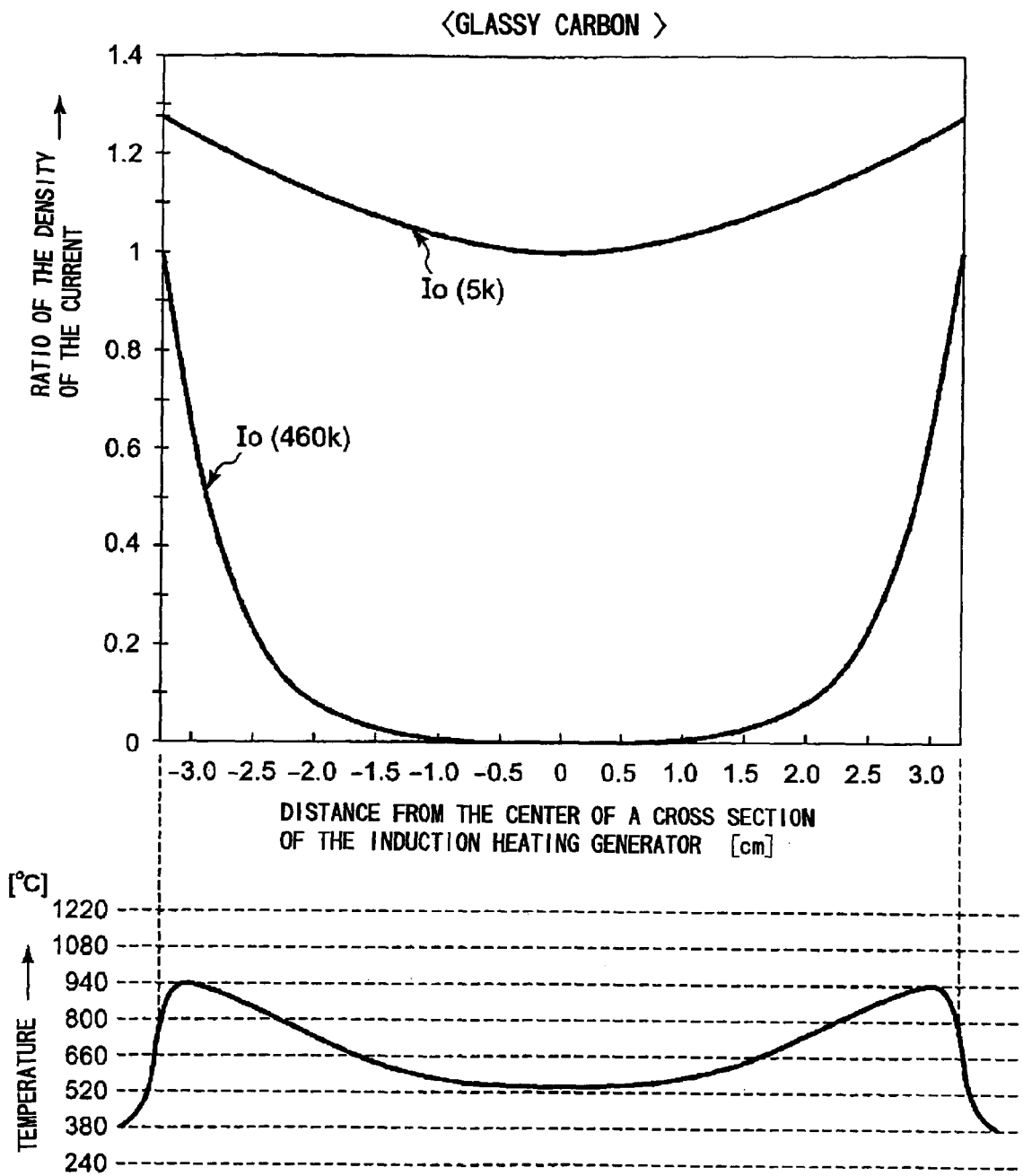
FIG. 6 is a graph showing a current density ratio in the case where glassy carbon is used, and dependency of the current density ratio on a frequency of high frequency power.
Figure 7:
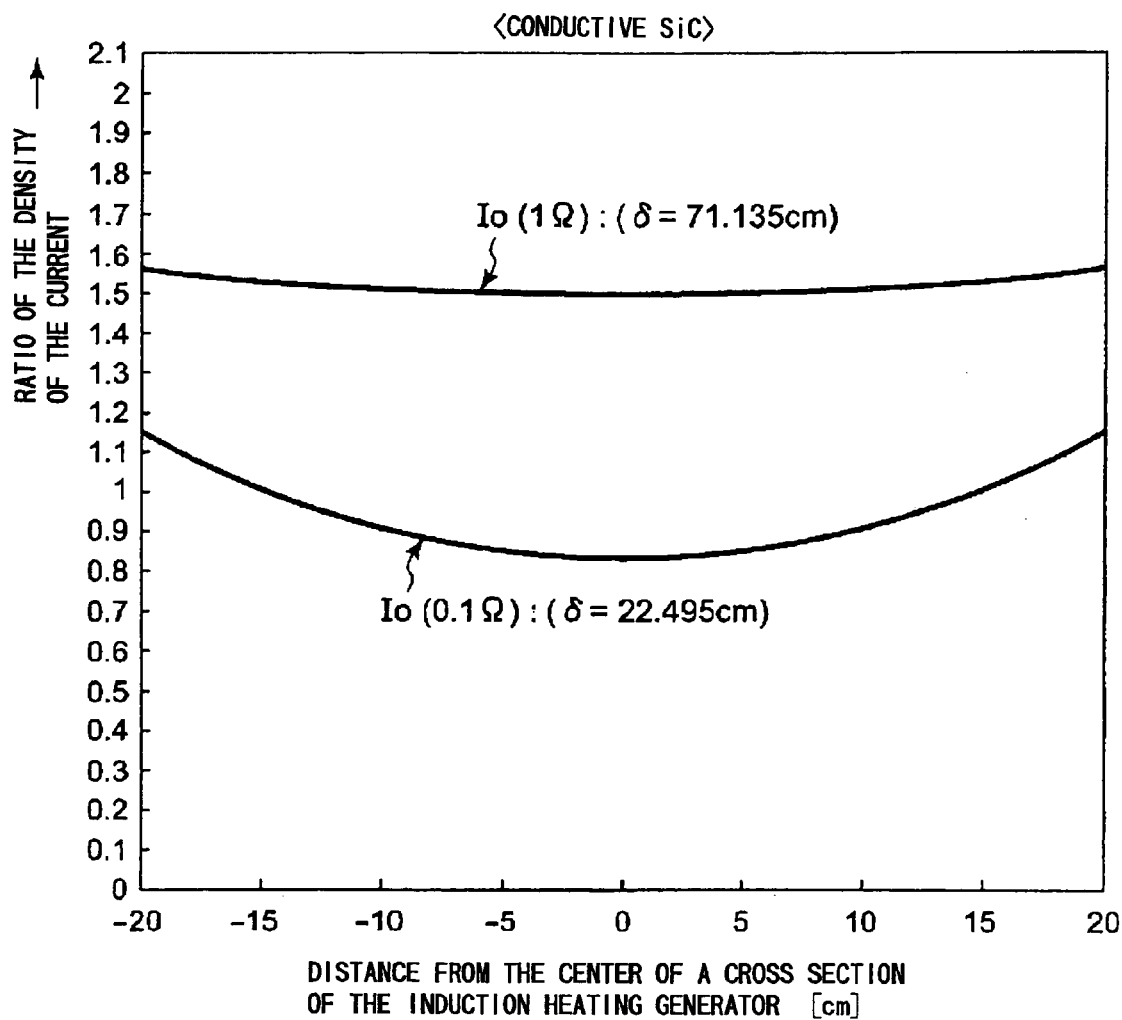
FIG. 7 is a graph showing a current density ratio in the case where conductive SiC is used, and dependency of the current density ratio on a frequency of high frequency power.

FIG. 6 is a graph showing the current density ratio obtained by using the glassy carbon and the dependence of the current density ratio on the frequency of the high frequency power. FIG. 7 is a graph showing the current density ratio obtained by using the conductive SiC and the dependence of the current density ratio on the frequency of the high frequency power. In each of FIGS. 6 and 7, only a summed current Io obtained in the same way as the summing in the FIG. 5 is shown. In each of FIGS. 6 and 7, a distance from the center of a cross section of the induction heating generator is plotted along the abscissa axis, while the ratio of the density of the current to the current present at the circumferential edges of the induction heating generator is plotted along the ordinate axis similar to that shown in FIG. 5.

The glassy carbon used to obtain the results shown in FIG. 6 has a diameter of 64 mm and resistivity of $0.0045\Omega\cdot cm$. The currents obtained by means of two frequencies of the high frequency power are shown in FIG. 6. In the graph shown in FIG. 6, a curved line Io (460 k) indicates a distribution of the current obtained by means of the frequency of 460 kHz, while a curved line Io (5 k) indicates a distribution of the current obtained by means of the frequency of 5 kHz.

As apparent from the graph and indicated by the curved line Io (460 k), when the frequency is 460 kHz, the summed current is rapidly reduced as a point at which the summed current is measured is farther from the circumferential edge of the induction heating generator and closer to the center of the induction heating generator. The summed current measured at the center of the induction heating generator is equal to "zero". This is not preferable. On the other hand, as indicated by the curved line Io (5 k), when the frequency is 5 kHz, a reduction in the summed current is in a range of approximately 1.3 to 1.0. It is apparent that the reduction in the summed current is significantly small. When the reduction in the summed current is in the range of approximately 1.3 to 1.0, and the heat conductivity of the induction heating generator is optimized, uniformity of the temperatures of the surface portions of the induction heating generator can be improved.

In this case, an optimal frequency of the high frequency power is in a range of 0.5 kHz to 50 kHz, preferable in a range of 1 kHz to 5 kHz as described above. When the frequency of the high frequency power is smaller than 0.5 kHz, the induction heating generators cannot be inductively heated in an efficient manner. When the frequency of the high frequency power is larger than 50 kHz, the skin effect is excessively large, and only the circumferential edges of the induction heating generators N are heated. As a result, the uniformity of the temperatures of the surface portions of each of the wafers W is significantly reduced.

It is preferable that a material constituting each of the induction heating generators N have large heat conductivity. For example, the material constituting each of the induction heating generators N preferably has heat conductivity of 5 W/mk or more, more preferably has heat conductivity of 100 W/mk or more. When the heat conductivity is smaller than 5 W/mk, the uniformity of the temperatures of the surface portions of each of the induction heating generators N is reduced. As a result, the uniformity of the temperatures of the surface portions of each of the wafers W is not sufficient. An example of a distribution of temperatures of the cross section of the induction heating generator when the frequency is 5 kHz is shown in a graph illustrated at a lower part of FIG. 6. The temperature of the circumferential edge of the induction heating generator is approximately 940° C., while the temperature of a central portion of the induction heating generator is approximately 520° C.

One type of the conductive SiC used to obtain the results shown in FIG. 7 has a diameter of 40 mm and resistivity of 1Ω·cm, while the other type of the conductive SiC used to obtain the results shown in FIG. 7 has a diameter of 40 mm and resistivity of 0.1Ω·cm. The frequency of the high frequency power is set to 5 kHz. In the graph of FIG. 7, a curved line Io (0.1Ω) indicates a distribution of a summed current obtained in the same way as the summing in the FIG. 5 in the case where the resistivity of the conductive SiC is 0.1Ω·cm, while a curved line Io (1Ω) indicates a distribution of a summed current obtained in the same way as the summing in the FIG. 5 in the case where the resistivity of the conductive SiC is 1Ω·cm.

As apparent from the graph of FIG. 7 and indicated by the curved line Io (0.1Ω), when the resistivity is 0.1Ω·cm, the current density ratio is in a range of 0.9 to 1.15. In this case, the current penetration depth 6 is 22.495 cm. On the other hand, when the resistivity is 1Ω·cm (indicated by the curved line Io (1Ω)), the current density ratio is in a range of 1.5 to 1.6. In this case, the current penetration depth 6 is 71.135 cm. Therefore, the conductive SiC having the resistivity of 1Ω·cm is more preferable than the conductive SiC having the resistivity of 0.1Ω·cm.

The resistivity of the conductive SiC is preferably in a range of 0.001Ω·cm to 0.5Ω·cm. When the resistivity of the conductive SiC is larger than 0.5Ω·cm, the efficiency to generate heat is significantly reduced. When the resistivity of the conductive SiC is smaller than 0.001Ω·cm, the current penetration depth is excessively small. This is not preferable.

In the present embodiment, the induction heating generators N are arranged close to the lower surfaces of the respective semiconductor wafers W to cause a gas present above an upper surface of each of the semiconductor wafers W to smoothly flow (refer to FIG. 3B). The present embodiment is not limited to this arrangement. The induction heating generators N may approach the upper surfaces of the respective semiconductor wafers W by lifting up the first holding boat 34 from the state shown in FIG. 3A. In addition, the second holding boat 36 may be movable up and down, instead of the first holding boat 34.

In the present embodiment, the holding unit 24 is rotatable. The present embodiment, however, is not limited to this. The holding unit 24 may be not rotatable (or may be in a fixed state). The first and second gases are respectively introduced from the first and second gas nozzles 92 and 94 into the lower portion of the treatment chamber 22, and are discharged from the top portion of the treatment chamber 22. The present embodiment is not limited to this configuration. The gases may be introduced into the top portion of the treatment chamber 22 and discharged from the lower portion of the treatment chamber 22. Each of the first and second gas nozzles 92 and 94 may be a distribution nozzle. That is, each of the first and second gas nozzles 92 and 94 may extend along a longitudinal direction of the treatment chamber 22 and have a plurality of gas ejection holes arranged at the same interval.

Figure 8A:
FIGS. 8A and 8B are diagrams each showing a modification of the induction heating generator.
Figure 8B:
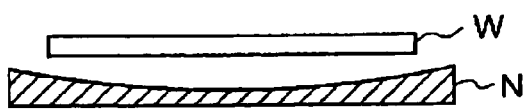

The treatment chamber 22 has a single tube structure as shown in FIG. 1. However, the structure of the treatment chamber 22 is not limited to this. The treatment chamber 22 may have a double tube structure. That is, the treatment chamber 22 may have an inner tube (made of quartz) and outer tube (made of quartz) concentrically arranged. Each of the induction heating generators N has a plate-like shape in the above-mentioned embodiment. However, the shape of each of the induction heating generators N is not limited to this. Each of the induction heating generators N may be shaped to ensure that the central portion of the induction heating generator N protrudes and is convex, and that the distance between the central portion of the induction heating generator N and the lower surface of the wafer W is smaller than the distance between the circumferential edge of the induction heating generator N and the lower surface of the wafer W, as shown in FIG. 8A illustrating a cross sectional shape of the induction heating generator N. On the other hand, each of the induction heating generators N may be shaped to ensure that the induction heating generator N has a dent and is concave at the central portion thereof, and that the distance between the central portion of the induction heating generator N and the lower surface of the wafer W is larger than the distance between the circumferential edge of the induction heating generator N and the lower surface of the wafer W, as shown in FIG. 8B illustrating a cross sectional shape of the induction heating generator N.

In the present embodiment, the holding unit 24 is constituted by the first and second holding boats 34 and 36. The configuration of the holding unit 24 is not limited to this. The holding unit 24 may be constituted by a single holding boat 130 as shown in FIG. 9. The holding boat 130 may be configured as disclosed in JP-A-8-44286. Specifically, the holding boat 130 has columns 132, circular ring members 134 and circular ring members 136. The columns 132 are made of quartz. Each of the ring members 134 has a small inner diameter and is made of quartz, and each of the ring members 136 has a large inner diameter and is made of quartz. The ring members 134 and 136 are joined to the columns 132 and alternately arranged.

Each of the ring members 134 has, at its inner circumference, a claw 134A for holding an edge portion of the wafer W, while each of the ring members 136 has, at its inner circumference, a claw 136A for holding an edge portion of the induction heating generator N having a larger diameter than that of the wafer W.

In this case, it is not possible to cause the wafers W and the induction heating generators N to be close to and apart from each other. Therefore, the ring members 134 and 136 and the claws 134A and 136A are configured to ensure that the wafers W and the induction heating generators N are as close as possible to each other.

In the present embodiment, the film formation treatment is described as the heat treatment as an example. The present embodiment is not limited to this. The present invention can be applied to other heat treatments, such as an oxidation treatment, diffusion treatment, reforming treatment, and etching treatment.

The present embodiment uses the glassy carbon and the conductive ceramic material (SiC) as the material of the induction heating generators N. However, the present embodiment is not limited to those materials. Graphite and the like may be used as the material of the induction heating generators N. As the conductive ceramic material, conductive silicon nitride may be used. The present embodiment uses the semiconductor wafers as the objects to be treated. However, the present embodiment is not limited to the semiconductor wafers. The present invention can be applied to a glass substrate, liquid crystal display substrate, ceramic substrate and the like.

What is claimed is:

1. A treatment apparatus for performing a heat treatment on plural objects to be treated, said apparatus comprising:
   a treatment chamber capable of accommodating the plurality of objects;
   an induction heating coil section wound around an outer circumference of the treatment chamber;
   a high frequency power supply that is connected with the induction heating coil section and adapted to apply high frequency power to the induction heating coil section;
   gas supply means that is provided for the treatment chamber and adapted to introduce a necessary gas into the treatment chamber; and
   holding means that is inserted in and removed from the treatment chamber under the condition that the holding means holds the objects and a plurality of induction heating generators, each induction heating generator being adapted to be inductively heated by means of a high frequency wave emitted by the induction heating coil and to thereby heat an object, the holding means having:
   a plurality of columns,
   a plurality of first ring members, each first ring member being provided between the columns and adapted to hold an object, and
   a plurality of second ring members, each second ring member being provided between the columns and adapted to hold an induction heating generator, the first ring members and the second ring members being alternately arranged whereby the objects and the induction heating generators are alternately arranged in the holding means.

2. The treatment apparatus according to claim 1, wherein a height of the treatment chamber is longer than a width of the treatment chamber.

3. The treatment apparatus according to claim 1, wherein the induction heating coil section has a metal pipe, and the metal pipe is connected with a cooler that allows a refrigerant to flow in the metal pipe.

4. The treatment apparatus according to claim 1, wherein the holding means is rotatable.

5. The treatment according to claim 1, wherein each object has a circular disk shape, and each induction heating generator has a circular disk shape and a diameter larger than that of each said object.

6. The treatment apparatus according to claim 1, wherein at least one induction heating generator is made of one or more materials selected from the group consisting of a conductive ceramic material, graphite, glassy carbon, conductive quartz and conductive silicon.

7. A treatment method for performing a heat treatment on plural objects to be treated, said method comprising the steps of:
   inserting holding means in a treatment chamber under the condition that the holding means holds the objects and induction heating generators, the holding means having a plurality of columns, a plurality of first ring members with each first ring member being provided between the columns and adapted to hold an object, and a plurality of second ring members with each second ring member being provided between the columns and adapted to hold an induction heating generator, the first ring members and the second ring members being alternately arranged whereby the objects and the induction heating generators are alternately arranged in the holding means, each induction heating generator being adapted to be inductively heated by means of a high frequency wave to thereby heat an object; and
   introducing a necessary gas into the treatment chamber while introducing the high frequency wave into each induction heating generator to inductively heat the induction heating generators, and heating the objects by means of the induction heating generators inductively heated in the heat treatment.

8. A storage medium storing a program that used for treatment method for performing a heat treatment on plural objects to be treated, the program running on a computer, wherein
   the treatment method includes the steps of:
   inserting holding means in a treatment chamber under the condition that the holding means holds the objects and induction heating generators, the holding means having a plurality of columns, a plurality of first ring members with each first ring member being provided between the columns and adapted to hold an object, and a plurality of second ring members with each second ring member being provided between the columns and adapted to hold an induction heating generator, the first ring members and the second ring members being alternately arranged whereby the objects and the induction heating generators are alternately arranged in the holding means, each induction heating generator being adapted to be inductively heated by means of a high frequency wave to thereby heat an object; and
   introducing a necessary gas into the treatment chamber while introducing the high frequency wave into each induction heating generator to inductively heat the induction heating generators, and heating the objects by means of the induction heating generators inductively heated in the heat treatment.

* * * * *